(12) United States Patent
Park

(10) Patent No.: US 6,549,452 B1
(45) Date of Patent: Apr. 15, 2003

(54) VARIABLE WIDTH WORDLINE PULSES IN A MEMORY DEVICE

(75) Inventor: Kee Park, Santa Clara, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/032,269

(22) Filed: Dec. 20, 2001

(51) Int. Cl.$^7$ ................................. G11C 11/00
(52) U.S. Cl. ................... 365/154; 365/189.04
(58) Field of Search ............. 365/154, 189.04, 365/203, 189.01, 194, 189.05, 230.06

(56) References Cited

U.S. PATENT DOCUMENTS

| | | | | |
|---|---|---|---|---|
| 4,768,168 A | * | 8/1988 | Watanabe | 365/189 |
| 5,267,197 A | | 11/1993 | McClure | |
| 5,404,327 A | | 4/1995 | Houston | |
| 5,907,508 A | | 5/1999 | Lattimore et al. | |
| 6,198,679 B1 | * | 3/2001 | Nakasu et al. | 365/203 |
| 6,252,814 B1 | * | 6/2001 | Tran et al. | 365/210 |
| 6,366,507 B1 | * | 4/2002 | Akioka et al. | 365/194 |

OTHER PUBLICATIONS

"9Mb Pipelined QDR™ SRAM Burst of 2" by Integrated Device Technology, Inc., Aug. 2000, pp. 1–17.
"9Mb Pipelined QDR™ SRAM Burst of 4" by Integrated Device Technology, Inc., Aug. 2000, pp. 1–17.

* cited by examiner

Primary Examiner—Michael S. Lebentritt
Assistant Examiner—Anh Phung
(74) Attorney, Agent, or Firm—Bever, Hoffman & Harms LLP

(57) ABSTRACT

A method for accessing an SRAM cell includes: determining whether an access is a read access or write access, applying a read word line pulse having a first width to a word line if the access is a read access, and applying a write word line pulse having a second width to the word line if the access is a write access, wherein the first and second widths are different. The method can further include: pre-charging a bit line pair of the SRAM cell for a first pre-charge period after de-asserting the read word line pulse, and pre-charging the bit line pair for a second pre-charge period after de-asserting the write word line pulse, wherein the first and second pre-charge periods are different. The cycle time of the SRAM cell is reduced by providing word line pulses having only the necessary widths and pre-charge operations having only the necessary periods.

17 Claims, 4 Drawing Sheets

VARIABLE WIDTH WORDLINE PULSES IN A MEMORY DEVICE

FIELD OF THE INVENTION

The present invention relates to memory systems. More specifically, the present invention relates to the control of read, write and pre-charge operations in a static random access memory (SRAM) system.

BACKGROUND OF THE INVENTION

FIG. 1 is a schematic diagram of a conventional SRAM cell 100. SRAM cell 100 includes access transistors 101–102, cross-coupled inverters 103–104, word line 110 and bit lines 111–112. Inverters 103–104 are formed by p-channel transistors 105–106 and n-channel transistors 107–108.

FIG. 2 is a waveform diagram illustrating the conventional operation of SRAM cell 100. SRAM cell 100 operates synchronously in response to a system clock signal, CLK. Prior to cycle C1, bit lines 111 and 112 are pre-charged to the $V_{dd}$ supply voltage and word line 110 is held at 0 Volts (ground). A write operation is initiated at the rising edge of clock cycle C1. After a time period $t_a$, a high WL signal is asserted on word line 110, thereby turning on access transistors 101 and 102. The word line signal WL is asserted as early as possible after the write operation is detected. In addition, a data signal having a full signal swing is applied to bit lines 111 and 112. That is, one of bit lines 111–112 is held at the $V_{dd}$ supply voltage, and the other one of bit lines 111–112 is pulled down to ground. Because access transistors 101 and 102 are turned on, the data value on bit lines 111–112 is latched into cross-coupled inverters 103–104.

The word line signal WL is asserted high for a time period $t_b$, which is long enough to insure that the data value on bit lines 111–112 is stored in cross-coupled inverters 103–104. At the end of time period $t_b$, the word line signal WL is de-asserted low. After access transistors 101–102 have been turned off by the low word line signal WL, the $V_{dd}$ supply voltage is applied to both of bit lines 111–112, thereby causing these bit lines to begin pre-charging to the $V_{dd}$ supply voltage. Note that one of bit lines 111–112 is already at the $V_{dd}$ supply voltage, while the other one of bit lines 111–112 must be pre-charged to the $V_{dd}$ supply voltage starting from 0 Volts. Pre-charging bit lines 111–112 to the $V_{dd}$ supply voltage after a write operation requires a pre-charge time period $t_c$. The pre-charge time period $t_c$ defines the minimum time required between de-asserting word line signal WL at the end of a write operation, and asserting word line signal WL at the beginning of a subsequent operation.

A read operation is initiated at the rising edge of clock cycle C2. After the time period $t_a$, a logic high word line signal WL is asserted on word line 110, thereby turning on access transistors 101 and 102. Note that the word line signal WL is not asserted until after bit lines 111–112 have had sufficient time to be pre-charged to the $V_{dd}$ supply voltage. That is, pre-charge time period $t_c$ must be completed before word line signal WL can be asserted. If the word line signal WL is asserted before bit lines 111–112 have been pre-charged to the $V_{dd}$ supply voltage, a read disturb condition may exist, resulting in a slower access time or a failed read operation.

The word line signal WL is again asserted high for the time period $t_b$, which has a duration sufficient to insure that the data value stored in SRAM cell 100 is read from cross-coupled inverters 103–104. During the read operation, one of bit lines 111–112 remains at the $V_{dd}$ supply voltage, and the other one of bit lines 111–112 is pulled down to a voltage which is less than the $V_{dd}$ supply voltage. A sense amplifier (not shown) senses this small difference to identify the data value stored in SRAM cell 100.

At the end of time period $t_b$, the word line signal WL is de-asserted low. After access transistors 101–102 have been turned off by the low word line signal WL, the $V_{dd}$ supply voltage is applied to both of bit lines 111–112, thereby causing these bit lines to begin pre-charging to the $V_{dd}$ supply voltage. Note that one of bit lines 111–112 is already at the $V_{dd}$ supply voltage, while the other one of bit lines 111–112 is pre-charged to the $V_{dd}$ supply voltage starting from a voltage slightly below the $V_{dd}$ supply voltage. Consequently, the pre-charge following a read operation can be completed in less time than a pre-charge following a write operation. However, the pre-charge time period $t_c$ is still provided at the end of the read operation.

A write operation is initiated at the rising edge of clock cycle C3. The write operation during clock cycle C3 is similar to the write operation during clock cycle C1. Thus, after the time period $t_a$, a high WL signal is asserted on word line 110, thereby turning on access transistors 101 and 102. Again, the pre-charge time period $t_c$ elapses between the time that the word line signal WL is de-asserted during the read cycle and the time that the word line signal WL is asserted during the write cycle.

The width of the word line pulse WL (i.e., $t_b$) is fixed, and is the same for both read and write operations. In addition, the time period $t_a$ between the rising edge of the clock signal and the rising edge of the word line signal WL is fixed, and is the same for read and write operations. Finally, the time period $t_c$ between the falling edge of the word line signal WL and the next rising edge of the word line signal WL is the same regardless of the nature of the corresponding operations (i.e., read or write operations).

In the described example, the cycle time ($t_{cyc}$) for SRAM cell 100 is equal to the duration $t_b$ of the word line pulse WL plus the pre-charge time period $t_c$. For example, the word line pulse width $t_b$ may have a value of 4 nsec and pre-charge time period tc may have a value of 2 nsec, such that the cycle time $t_{cyc}$ is equal to 6.0 nsec. It would be desirable to have a system and a method for reducing the cycle time of SRAM cell 100.

SUMMARY

Accordingly, the present invention provides a method of accessing an SRAM cell that includes the steps of: (1) determining whether an access to the SRAM cell is a read access or a write access, (2) applying a first word line pulse having a first width to the word line if the access is a read access, and (3) applying a second word line pulse having a second width to the word line if the access is a write access, wherein the first width is different than the second width. For example, the width of the first word line pulse required to perform a read access may be greater than the width of the second word line pulse required to perform a write access. The cycle time of the SRAM cell is reduced by applying word line pulses having only the necessary widths.

In another embodiment, the method further includes the steps of: pre-charging a pair of bit lines coupled to the SRAM cell for a first pre-charge period after de-asserting the first word line pulse, and pre-charging the pair of bit lines for a second pre-charge period after de-asserting the second word line pulse, wherein the first pre-charge period is different than the second pre-charge period. For example, the first pre-charge period will be less than the second pre-charge period if it takes less time to pre-charge after a read operation than after a write operation. Again, the cycle time of the SRAM cell is reduced by providing pre-charge operations having only the necessary periods. Another embodiment provides a method of operating an SRAM system in which read operations are prohibited from being initiated during consecutive cycles of the SRAM system. This method includes the steps of: (1) applying a word line pulse to a word line of the SRAM system for a first period if the access is a read access, (2) applying a word line pulse to a word line of the SRAM system for a second period if the access is a write access, wherein the first period is different than the second period, and (3) pre-charging a pair of bit lines of the SRAM system for a pre-charge period after applying the word line pulse during the write access, wherein the cycle time of the SRAM system is equal to the sum of the first period, the second period and the pre-charge period. Alternatively, the cycle time of the SRAM system can be equal to one half of the sum of the first period, the second period and the pre-charge period.

In this embodiment, the cycle time is reduced by the pre-charge period previously required after a read operation. Additional time does not have to be provided in the cycle time for pre-charging after a read operation because only a write operation or no operation can follow a read operation. If a write operation follows a read operation, the write drivers are strong enough to overcome the small voltage differences that may remain on the bit lines after a read operation. If no operation follows a read operation, then the read pre-charge operation has an entire no-operation cycle to pre-charge the bit lines.

The present invention will be more fully understood in view of the following description and drawings.

DETAILED DESCRIPTION

Figure 3:
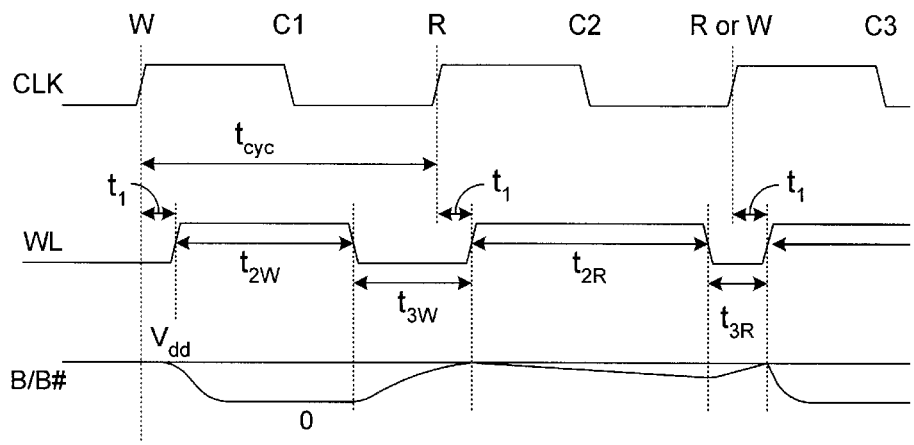
FIG. 3 is a waveform diagram illustrating the operation of the SRAM cell of FIG. 1 in accordance with one embodiment of the present invention.

FIG. 3 is a waveform diagram illustrating the operation of SRAM cell 100 in accordance with one embodiment of the present invention. Prior to clock cycle C1, bit lines 111 and 112 are pre-charged to the $V_{dd}$ supply voltage. A write operation is initiated at the rising edge of clock cycle C1. After a time period $t_1$, a high WL signal is asserted on word line 110, thereby turning on access transistors 101 and 102. The word line signal WL is asserted as early as possible after the rising edge of the clock signal CLK. In addition, a data signal having a full signal swing is applied to bit lines 111 and 112. That is, one of bit lines 111–112 is held at the $V_{dd}$ supply voltage, and the other one of bit lines 111–112 is pulled down to ground. Because access transistors 101 and 102 are turned on, this data value is latched into cross-coupled inverters 103–104 of SRAM cell 100.

The word line signal WL is asserted high for a time period $t_{2W}$, which is selected to have a duration sufficient to insure that the data value is stored in cross-coupled inverters 103–104. In the described example, time period $t_{2W}$ is equal to about 3 nsec. At the end of time period $t_{2W}$, the word line signal WL is de-asserted low, and bit lines 111–112 begin pre-charging to the $V_{dd}$ supply voltage. Note that one of bit lines 111–112 is already at the $V_{dd}$ supply voltage, while the other one of bit lines 111–112 must be pre-charged to the $V_{dd}$ supply voltage starting from 0 Volts. Pre-charging bit lines 111–112 to the $V_{dd}$ supply voltage after a write operation requires a pre-charge time period $t_{3W}$. The pre-charge time period $t_{3W}$ is the minimum time required between de-asserting word line signal WL during a write cycle and asserting the word line signal WL during the next read or write cycle. In the described example, the pre-charge time period for a write operation $t_{3W}$ is equal to about 2 nsec.

A read operation is initiated at the rising edge of clock cycle C2. After the time period $t_1$, a high word line signal WL is asserted on word line 110, thereby turning on access transistors 101 and 102. Note that the word line signal WL is not asserted until after bit lines 111–112 have had sufficient time to be pre-charged to the $V_{dd}$ supply voltage. That is, pre-charge time period $t_{3W}$ expires before the word line signal WL is asserted.

The word line signal WL is asserted high for the time period $t_{2R}$, which has a duration sufficient to insure that the data value is read from cross-coupled inverters 103–104. During the read operation, one of bit lines 111–112 remains at the $V_{dd}$ supply voltage, and the other one of bit lines 111–112 is pulled down to a voltage which is slightly less than the $V_{dd}$ supply voltage. In the described embodiment, one of the bit lines 111–112 is pulled down to a voltage that is about 0.3 to 0.5 Volts less than the $V_{dd}$ supply voltage, although this particular voltage range is not necessary. A sense amplifier (not shown) senses this small voltage difference to determine the value of the data stored in SRAM cell 100.

In the described embodiment, the time period $t_{2R}$ is equal to 4 nsec. That is, the required width of a word line pulse during a read operation (i.e., $t_{2R}$) is greater than the required width of a word line pulse during a write operation (i.e., $t_{2W}$).

At the end of time period $t_{2R}$, the word line signal WL is de-asserted low, and bit lines 111–112 begin pre-charging to the $V_{dd}$ supply voltage. Because the low bit line starts from a voltage relatively close to the $V_{dd}$ supply voltage, the pre-charge following a read operation can be completed in less time than a pre-charge following a write operation. Pre-charging bit lines 111–112 to the $V_{dd}$ supply voltage after a read operation requires a pre-charge time period $t_{3R}$. The pre-charge time period $t_{3R}$ is the minimum time required between de-asserting word line signal WL during a read cycle and asserting the word line signal WL during the next cycle. In the described example, the pre-charge time period for a read operation $t_{3R}$ is about 1 nsec.

Another operation (read or write) is initiated at the rising edge of clock cycle C3. The operation performed during clock cycle C3 is similar to either the write operation performed during clock cycle C1 or the read operation performed during clock cycle C2. Thus, after the time period $t_1$, a high WL signal is asserted on word line 110, thereby turning on access transistors 101 and 102. The pre-charge time period $t_{3R}$ elapses between the time that the word line signal WL is de-asserted during the read cycle C2 and the time that the word line signal WL is asserted during the cycle C3.

In the described example, the cycle time for a write operation is equal to $t_{2W}+t_{3W}$, (3 nsec+2 nsec) or 5 nsec. Similarly, the cycle time for a read operation is equal to $t_{2R}+t_{3R}$, (4 nsec+1 nsec) or 5 nsec. Thus, the cycle time $t_{cyc}$ for the embodiment of FIG. 3 is equal to 5 nsec.

Figure 1:
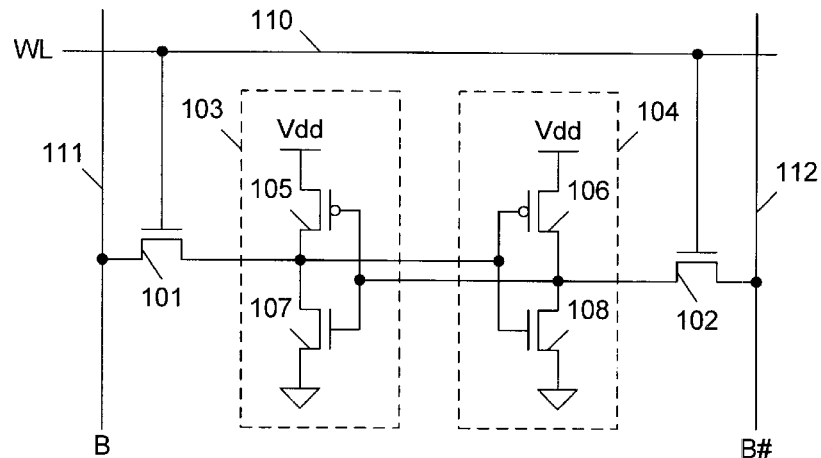
FIG. 1 is a schematic diagram of a conventional SRAM cell.
Figure 2:
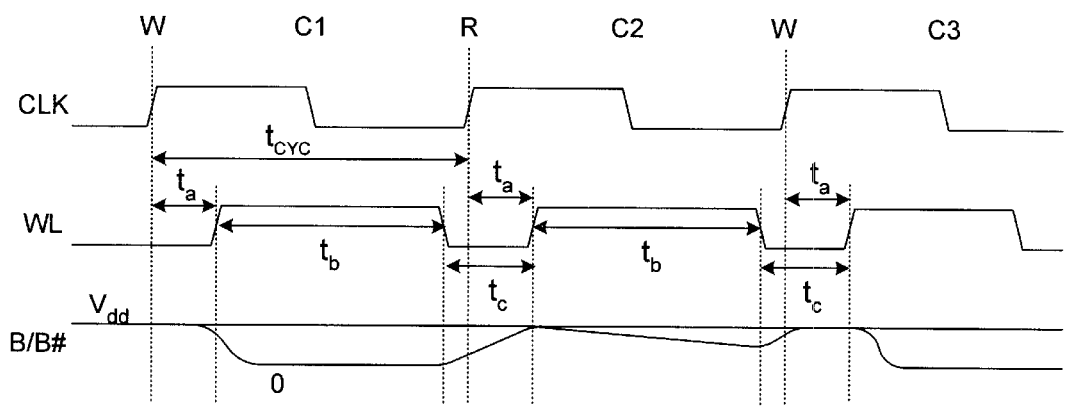
FIG. 2 is a waveform diagram illustrating the conventional operation of SRAM cell.

In comparison, the prior art method of FIG. 2 would select the longer of the word line pulse durations $t_{2W}$ and $t_{2R}$ (i.e., 4 nsec) as the word line pulse duration $t_b$ for both the read and write operations. Similarly, the prior art method of FIG. 2 would select the longer of the bit line pre-charge durations $t_{3W}$ and $t_{3R}$, (i.e., 2 nsec) for both the read and write operations. As a result, the prior art scheme would require a cycle time of 6 nsec (i.e., 4 nsec+2 nsec). The cycle time is therefore reduced by 1 nsec in the present example.

Figure 4:
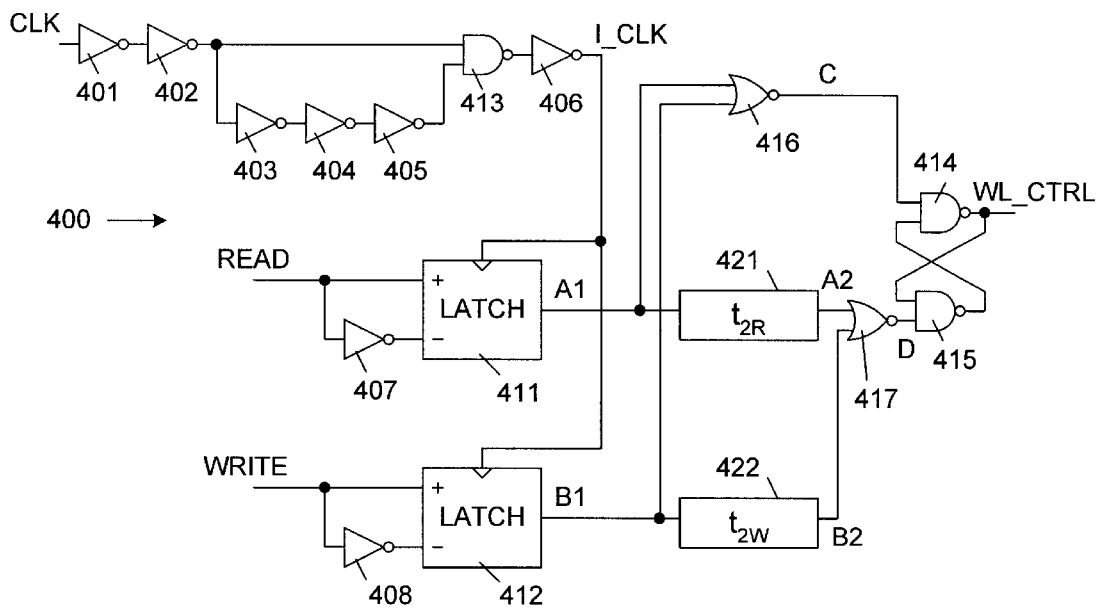
FIG. 4 is a circuit diagram of a word line pulse width generator in accordance with one embodiment of the present invention.

In order to implement the present invention, word line pulses of different widths must be asserted during read and write operations. FIG. 4 is a circuit diagram of a word line pulse width signal generator 400 in accordance with one embodiment of the present invention. Word line pulse width signal generator 400 includes inverters 401–408, input latches 411–412, NAND gates 413–415, NOR gates 416–417 and delay lines 421–422, which are connected as illustrated.

Figure 5:
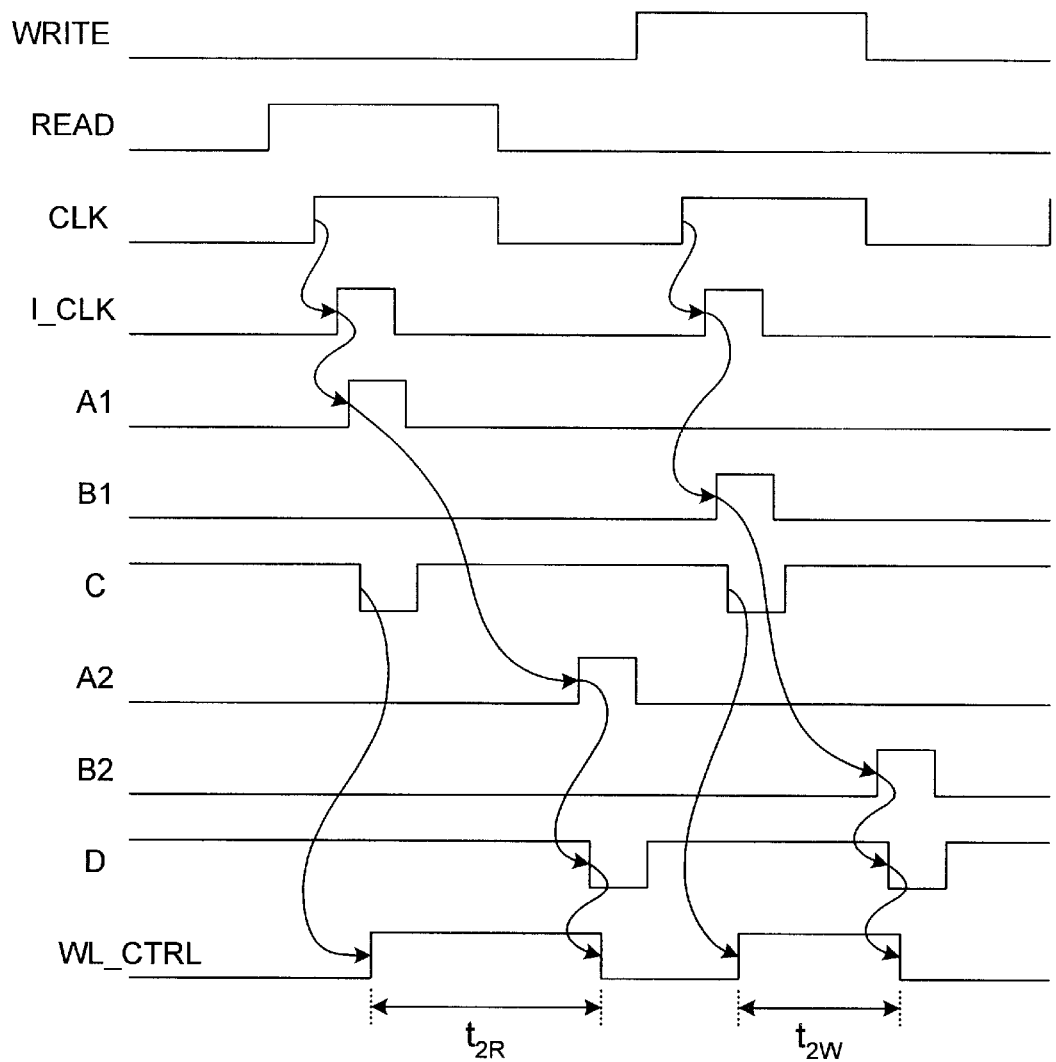
FIG. 5 is a waveform diagram illustrating the signals generated by the word line pulse width generator of FIG. 4 in accordance with one example.

FIG. 5 is a waveform diagram illustrating the signals generated by word line pulse width signal generator 400 in accordance with one example. The system clock signal CLK is provided to the input terminal of inverter 401. Inverters 401–406 and NAND gate 413 are configured to provide an internal clock signal, I_CLK. The I_CLK signal transitions to a logic high state in response to a rising edge of the CLK signal, and subsequently transitions to a logic low state at a time determined by the delay introduced by inverters 403–405.

The logic high I_CLK signal is applied to the clock input terminals of input latches 411 and 412. The other input terminals of latch 411 are coupled to receive a READ control signal, and the inverse of the READ control signal (via inverter 407). The other input terminals of latch 412 are coupled to receive a WRITE control signal, and the inverse of the WRITE control signal (via inverter 408).

In general, input latch 411 operates as follows. On the rising edge of the I_CLK signal, the READ control signal is clocked into latch 411. At this time, latch 411 provides the latched READ control signal as the control signal A1. Upon detecting the next falling edge of the I_CLK signal, latch 411 provides a logic low output signal until the next rising edge of the I_CLK signal, when the above-described operation is repeated. Input latch 412 operates in the same manner as input latch 411.

During the first clock cycle, the READ control signal has a logic high value and the WRITE control signal has a logic low value, thereby indicating that the current access is a read operation. The logic high READ control signal is clocked into latch 411 at the rising edge of the I_CLK signal. In response, latch 411 provides a logic high control signal A1, until the I_CLK signal transitions to a logic low state. At this time, latch 411 provides a logic low control signal A1. The logic low WRITE control signal is clocked into latch 412 at the rising edge of the I_CLK signal. In response, latch 412 provides a logic low control signal B1.

The control signal "C" provided by NOR gate 416 transitions from a logic high state to a logic low state in response to the rising edge of the control signal A1. Control signal C transitions back to a high state after control signal A1 transitions to a low state. In response to the falling edge of control signal C, NAND 414 asserts the word line pulse width control signal WL_CTRL to a logic high state.

Delay circuit 421 introduces a delay of $t_{2R}$ to control signal A1, thereby creating control signal A2. Thus, control signal A2 transitions to a logic high state after a delay of $t_{2R}$ from the rising edge of control signal A1.

The rising edge of control signal A2 causes NOR gate 417 to provide a logic low control signal "D". In response, NAND gate 415 provides a logic high output signal, thereby causing NAND gate 414 to provide a logic low word line pulse width control signal WL_CTRL. As a result, word line pulse width generation circuit 400 provides a word line pulse width control signal WL_CTRL having a pulse width of $T_{2R}$.

At the beginning of the second clock cycle, the I_CLK signal is again pulsed in response to the rising edge of the CLK signal. During the second clock cycle, the WRITE control signal has a logic high value and the READ control signal has a logic low value, thereby indicating that the current access is a write operation. The logic high WRITE control signal is clocked into latch 412 at the rising edge of the I_CLK signal. In response, latch 412 provides a logic high control signal B1, until the I_CLK signal transitions to a logic low state. At this time, latch 412 provides a logic low control signal B1. The logic low READ control signal is clocked into latch 411 at the rising edge of the I_CLK signal. In response, latch 411 provides a logic low control signal A1.

The control signal "C" provided by NOR gate 416 transitions from a logic high state to a logic low state in response to the rising edge of the control signal B1. Control signal C transitions back to a high state after control signal B1 transitions to a low state. In response to the falling edge of control signal C, NAND gate 414 asserts the word line pulse width control signal WL_CTRL to a logic high state.

Delay circuit 422 introduces a delay of $t_{2W}$ to control signal B1, thereby creating control signal B2. Thus, control signal B2 transitions to a logic high state after a delay of $t_{2W}$ from the rising edge of control signal B1.

The rising edge of control signal B2 causes NOR gate 417 to provide a logic low control signal "D". In response, NAND gate 415 provides a logic high output signal, thereby causing NAND gate 414 to provide a logic low word line pulse width control signal WL_CTRL. As a result, word line pulse width generation circuit 400 provides a word line pulse width control signal WL_CTRL having a pulse width of $t_{2W}$. The word line pulse width control signal WL_CTRL is used to control the width of the word line pulse. For example, the word line pulse width control signal WL_CTRL signal can be logically AND'ed with an address provided from the external input to activate the selected word line.

In accordance with another embodiment of the present invention, the above-described operating scheme can be applied to specific SRAM systems provided by Integrated Device Technology (IDT), Inc. Examples of such SRAM systems are described in the documents "9 Mb Pipelined QDR™ SRAM Burst of 2", Advance Information IDT71T62805 and "9 Mb Pipelined QDR™ SRAM Burst of 4", Advance Information IDT71T64805 available from IDT, Inc., which are hereby incorporated by reference.

Figure 6:
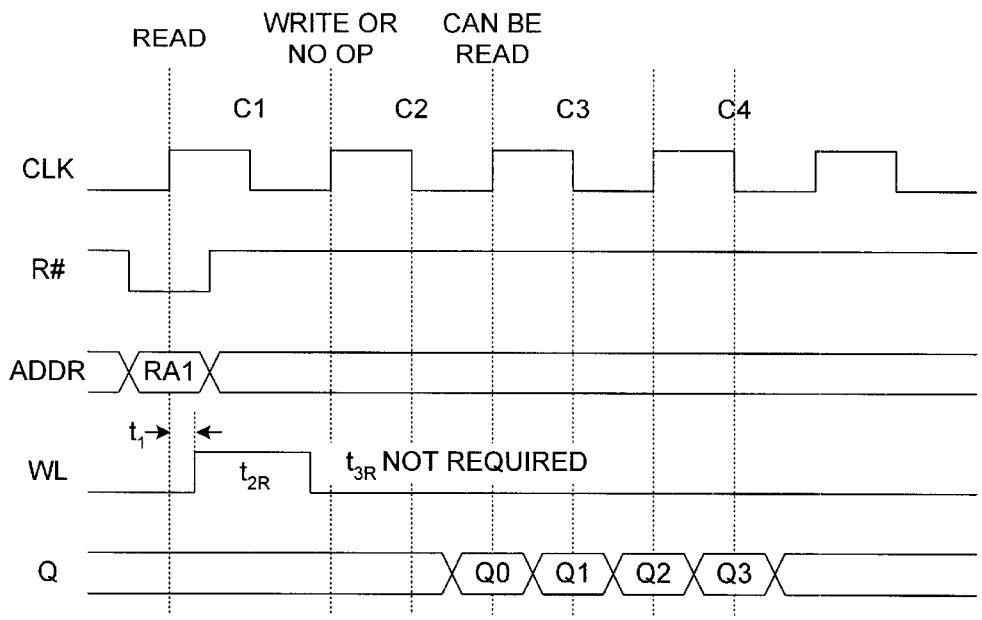
FIG. 6 is a waveform diagram illustrating the operation of a "burst of 4" SRAM device in accordance with one embodiment of the invention.

FIG. 6 is a waveform diagram illustrating the operation of the "burst of 4" SRAM device. At the rising edge of the first clock cycle C1, a logic low read enable signal (R#) and a first read address RA1 are detected, thereby initiating a burst read operation. After the first time period $t_1$, the word line signal WL is asserted high for a duration of $t_{2R}$, thereby causing four 18-bit words Q0–Q3 to be read from SRAM cells and stored in an output data register. Data words Q0–Q3 are consecutively provided on an output bus in response to the falling edge of clock cycle C2, the rising edge of clock cycle C3, the falling edge of clock cycle C3 and the rising edge of clock cycle C4, respectively. Consequently, a second burst read operation cannot be started during clock cycle C2, as this read operation would provide data on the output bus during cycle C3, in conflict with the first burst read operation. In the "burst of 4" SRAM device, a second burst read operation therefore cannot be initiated until the rising edge of the third clock cycle C3.

As defined within the "burst of 4" SRAM device, only a write operation or no operation can be initiated at the rising edge of clock cycle C2. If no operation is initiated at the rising edge of clock cycle C2, then the bit lines have the entire clock cycle C2 to pre-charge. In this case, the pre-charge time requirement of $t_{3R}$ is easily met. If a write operation is initiated at the rising edge of clock cycle C2, then bit line pairs of the "burst of 4" SRAM device are driven to the $V_{dd}$ supply voltage and the ground voltage. The write drivers are sufficient to overcome the voltages on the bit lines during the previous read operation. That is, the write drivers are strong enough to drive the desired voltages onto the bit lines, even though half of the bit lines are initially at a voltage that is slightly less than the $V_{dd}$ supply voltage. As a result, it is not necessary to meet the pre-charge time requirement of $t_{3R}$ when a write operation follows a read operation.

For the foregoing reasons, the read pre-charge time $t_{3R}$ is not required at the end of a read operation in the "burst of 4" SRAM device. As a result, the cycle time of the "burst of 4" SRAM device is equal to one half of the sum of the word line signal periods $t_{2W}$ and $t_{2R}$ and the bit line pre-charge period $t_{3W}$. Using the numbers given in the above-described example, the cycle time would be:

(4 nsec+3 nsec+2 nsec)/2=4.5 nsec.

Thus, by eliminating pre-charge after a read operation, the cycle time can be reduced (e.g., by 0.5 nsec) in an SRAM device which does not allow read operations to be initiated during consecutive clock cycles.

Figure 7:
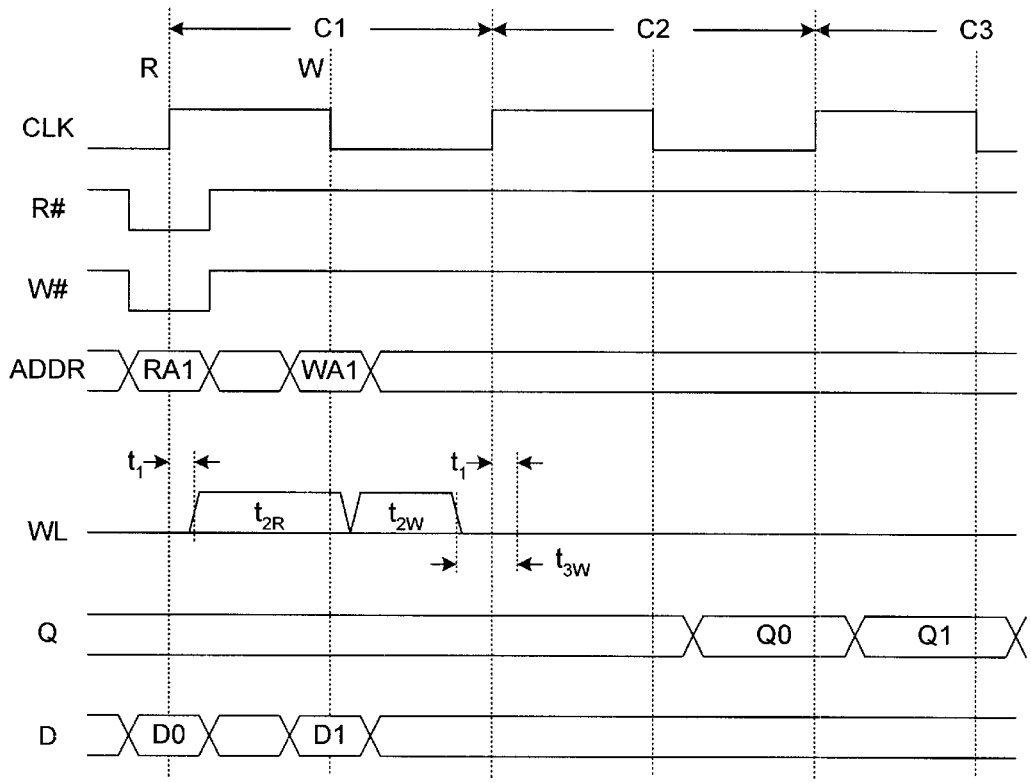
FIG. 7 is a waveform diagram illustrating the operation of the "burst of 2" SRAM device in accordance with one embodiment of the invention.

FIG. 7 is a waveform diagram illustrating the operation of the "burst of 2" SRAM device in accordance with one embodiment of the present invention.

Prior to the rising edge of the first clock cycle C1, a read enable signal (R#) and a write enable signal (W#) are both asserted low, thereby initiating both a burst read operation and a burst write operation. In addition, a first read address RA1 and a first write data value D0 are provided. These signals are detected at the rising edge of clock cycle C1, with data value D0 being stored in an input register.

The read operation is performed first. Thus, after the first time period $t_1$, a word line signal WL is asserted high for a duration of $t_{2R}$, thereby causing two 18-bit words Q0–Q1 to be read from SRAM cells and stored in an output data register. The particular word line signal asserted is selected in response to the read address signal RA1. Data words Q0–Q1 are subsequently provided on the output bus at the falling edge of clock cycle C2 and the rising edge of the clock cycle C3, respectively. Based on this read burst timing, a second read operation cannot be started until the rising edge of clock cycle C2 (such that the next read data word is provided on the output data bus at the falling edge of clock cycle C3).

Prior to the falling edge of clock cycle C1, a second write data value D1 and a write address WA1 are provided. At the falling edge of clock cycle C1, the second write data value D1 and the write address WA1 are stored in the input register with the first write data value. Immediately after the read word line signal is de-asserted low at the end of period $t_{2R}$, a write word line signal WL is asserted high for a duration of $t_2w$, thereby causing two 18-bit words to be written to SRAM cells in the SRAM device. Note that the words written during cycle C1 and the write address used during cycle C1 were stored in the input register during a previous cycle, and that the first and second data words D0–D1 and the write address WA1 are stored in the input register for use during the next burst write operation.

During the burst write operation, bit line pairs of the "burst of 2" SRAM device are driven to the $V_{dd}$ supply voltage and the ground voltage. The write drivers are sufficient to overcome the voltages on the bit lines during the previous read operation. That is, the write drivers are strong enough to drive the desired voltages onto the bit lines, even though half of the bit lines are initially at a voltage that is slightly less than the $V_{dd}$ supply voltage. As a result, it is not necessary to meet the pre-charge time requirement of $t_{3R}$ when a write operation follows a read operation. It is only necessary that the read word line be turned off prior to turning on the write word line.

After the word line signal WL is de-asserted low (after $t_{2W}$) the bit lines are pre-charged during write pre-charge period $t_{3W}$. The write pre-charge period $t_{3W}$ ends no later than the rising edge of clock cycle C2 plus the time period $t_1$. As a result, the bit lines are properly pre-charged before a word line can be asserted for a burst read operation.

Although FIG. 7 illustrates the end of period $t_{3W}$ corresponding with the end of period $t_1$, this is not necessary. For example, period $t_{3W}$ may expire prior to the rising edge of clock cycle C2. In addition, although FIG. 7 illustrates the period $t_{2R}$ as ending after the falling edge of clock cycle C1, this is not necessary. For example, period $t_{2R}$ may expire during the first half of clock cycle C1. Furthermore, although FIG. 7 illustrates the period $t_{2W}$ as starting after the falling edge of cycle C1, this is not necessary. For example, period $t_{2W}$ can start prior to the falling edge of cycle C1. In fact, the entire period $t_{2W}$ may expire during the first half of clock cycle C1 in certain embodiments. Finally, although FIG. 7 illustrates a read operation followed by a write operation, it is understood that the present invention can also be implemented by having a write command on the rising edge of a clock signal and a read command on the falling edge of a clock signal.

Note that if there is no write operation initiated during clock cycle C1, then the bit lines involved with the burst read operation are pre-charged during the time between the falling edge of read period $t_{2R}$ and the end of period $t_1$ after the rising edge of cycle C2. In this case, the pre-charge time requirement of $t_{3R}$ is easily met.

Because consecutive read operations cannot be performed by the "burst of 2" SRAM device, the read pre-charge time $t_{3R}$ is not required in the embodiment of FIG. 7. Thus, the cycle time is equal to the sum of the word line pulse durations $t_{2W}$ and $t_{2R}$ and the bit line pre-charge duration $t_{3W}$. Using the numbers given in the above-described example, the cycle time would be:

4 nsec+3 nsec+2 nsec=9 nsec.

While this cycle time is longer than those described above, it is noted that both a burst read operation and a burst write operation are performed within this cycle time.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. A method of accessing an SRAM cell having a word line, the method comprising the steps of:
   determining whether an access to the SRAM cell is a read access or a write access;
   applying a word line pulse having a first width to the word line if the access is a read access; and
   applying a word line pulse having a second width to the word line if the access is a write access, wherein the first width is different than the second width, wherein the first width is less than the second width.

2. A method of accessing an SRAM cell having a word line, the method comprising the steps of:
   determining whether an access to the SRAM cell is a read access or a write access;
   applying a word line pulse having a first width to the word line if the access is a read access;
   applying a word line pulse having a second width to the word line if the access is a write access, wherein the first width is different than the second width;
   pre-charging a pair of bit lines coupled to the SRAM cell for a first pre-charge period after applying the word line pulse having the first width; and
   pre-charging the pair of bit lines for a second pre-charge period after applying the word line pulse having the second width, wherein the first pre-charge period is different than the second pre-charge period.

3. The method of claim 2, wherein the first pre-charge period is less than the second pre-charge period.

4. The method of claim 3, wherein the first width is greater than the second width.

5. The method of claim 4, wherein the first width plus the first pre-charge period is approximately the same as the second width plus the second pre-charge period.

6. A method of operating a static random access memory (SRAM) system, the method comprising the steps of:
   preventing read operations from being initiated during consecutive cycles of the SRAM system;
   determining whether an access to the SRAM system is a read access or a write access;
   applying a word line pulse to a word line of the SRAM system for a first period if the access is a read access;
   applying a word line pulse to a word line of the SRAM system for a second period if the access is a write access, wherein the first period is different than the second period;
   pre-charging a pair of bit lines of the SRAM system for a pre-charge period after applying the word line pulse having the second period,
   wherein a cycle time of the SRAM system is equal to the sum of the first period, the second period and the pre-charge period.

7. The method of claim 6, wherein the first period is greater than the second period.

8. The method of claim 6, further comprising the step of transferring a plurality of data values on an output bus during a read access, wherein a data value is provided on the output bus on each transition of a system clock signal.

9. The method of claim 6, further comprising the step of transferring a plurality of data values on an input bus during a write access, wherein a data value is provided on the input bus on each transition of a system clock signal.

10. The method of claim 6, further comprising the step of initiating a read access and a write access during a single cycle of a system clock signal.

11. The method of claim 6, further comprising the steps of:
    initiating a read access during a first cycle of a system clock signal; and immediately thereafter
    initiating an write access during a second cycle of the system clock signal.

12. A method of operating a static random access memory (SRAM) system, the method comprising the steps of:
    preventing read operations from being initiated during consecutive cycles of the SRAM system;
    determining whether an access to the SRAM system is a read access or a write access;
    applying a word line pulse to a word line of the SRAM system for a first period if the access is a read access;
    applying a word line pulse to a word line of the SRAM system for a second period if the access is a write access, wherein the first period is different than the second period;
    pre-charging a pair of bit lines of the SRAM system for a pre-charge period after applying the word line pulse having the second period,
    wherein a cycle time of the SRAM system is equal to one half of the sum of the first period, the second period and the pre-charge period.

13. The method of claim 12, wherein the first period is greater than the second period.

14. The method of claim 12, further comprising the step of transferring a plurality of data values on an output bus during a read access, wherein a data value is provided on the output bus on each transition of a system clock signal.

15. The method of claim 12, further comprising the step of transferring a plurality of data values on an input bus during a write access, wherein a data value is provided on the input bus on each transition of a system clock signal.

16. The method of claim 12, further comprising the step of initiating a read access and a write access during a single cycle of a system clock signal.

17. The method of claim 12, further comprising the steps of:
    initiating a read access during a first cycle of a system clock signal; and immediately thereafter
    initiating an write access during a second cycle of the system clock signal.

* * * * *